United States Patent
Annoura et al.

(10) Patent No.: US 6,258,410 B1
(45) Date of Patent: *Jul. 10, 2001

(54) METHOD AND APPARATUS FOR MANUFACTURING SENSITIZED PRINTING PLATE

(75) Inventors: Yasuhiro Annoura; Takanori Masuda; Koichiro Aono; Tsutomu Kato, all of Shizuoka (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,296

(22) Filed: Jan. 22, 1999

(51) Int. Cl.$^7$ ........................................... B05D 3/12
(52) U.S. Cl. ........................ 427/289; 427/356; 427/358
(58) Field of Search .................... 427/289, 356, 427/358

(56) References Cited

U.S. PATENT DOCUMENTS

| 4,109,500 | 8/1978 | Franek ................................. 72/203 |
| 4,282,996 | 8/1981 | Maeda et al. ........................... 225/2 |
| 5,826,512 | 10/1998 | Niegawa et al. ..................... 101/454 |

FOREIGN PATENT DOCUMENTS

| 685687 | 9/1995 | (CH) | ............................. B26D/1/15 |
| 2293019 | 3/1996 | (GB) | ............................. G03F/7/16 |
| 55-91696 | 7/1980 | (JP) | ............................. B41N/1/08 |
| 62-19315 | 1/1987 | (JP) | ............................. B23D/15/06 |
| 62275267 | 11/1987 | (JP) | ............................. G03F/7/02 |
| 5-104871 | 4/1993 | (JP) | ............................. B41N/1/08 |
| 7-32758 | 2/1995 | (JP) | ............................. B41N/1/08 |
| 8-11451 | 1/1996 | (JP) | ............................. B41N/1/08 |
| 9-52465 | 2/1997 | (JP) | ............................. B41N/1/08 |
| 9-52466 | 2/1997 | (JP) | ............................. B41N/1/08 |

OTHER PUBLICATIONS

Document 1: Committee for Editing New Engineering Review of Cutting, "New Engineering Review of Cutting," Mar. 20, 1985, pp. 220–221, Service Center of Industrial Technology, Co., Ltd., Japan.

Document 2: Committee for Editing Manual for Aluminum Technology (Kawamura et al.,) "Manual for Aluminum Technology," Jun. 16, 1985, pp. 757–758, Light Metal Publishing Co., Ltd., Japan.

European Search Report, 6–98.

Primary Examiner—Bernard Pianalto
(74) Attorney, Agent, or Firm—Sughrue, Mion, Zinn, Macpeak & Seas, PLLC

(57) ABSTRACT

A clearance between an upper knife and a lower knife of a slitter is set at 30 to 100 $\mu$m, and the slitter cuts a sensitized printing plate. In the sensitized printing plate cut by the slitter, there is a shear droop which is 20 to 30 $\mu$m high at the cut part, and a burr which is less than 50 $\mu$m high. If the maximum height of a surface roughness of a cut surface of the sensitized printing plate is 1.2 $\mu$m to 12 $\mu$m on the average, a hydrophilic property of the cut part improves and the stain of a frame can be decreased.

3 Claims, 12 Drawing Sheets

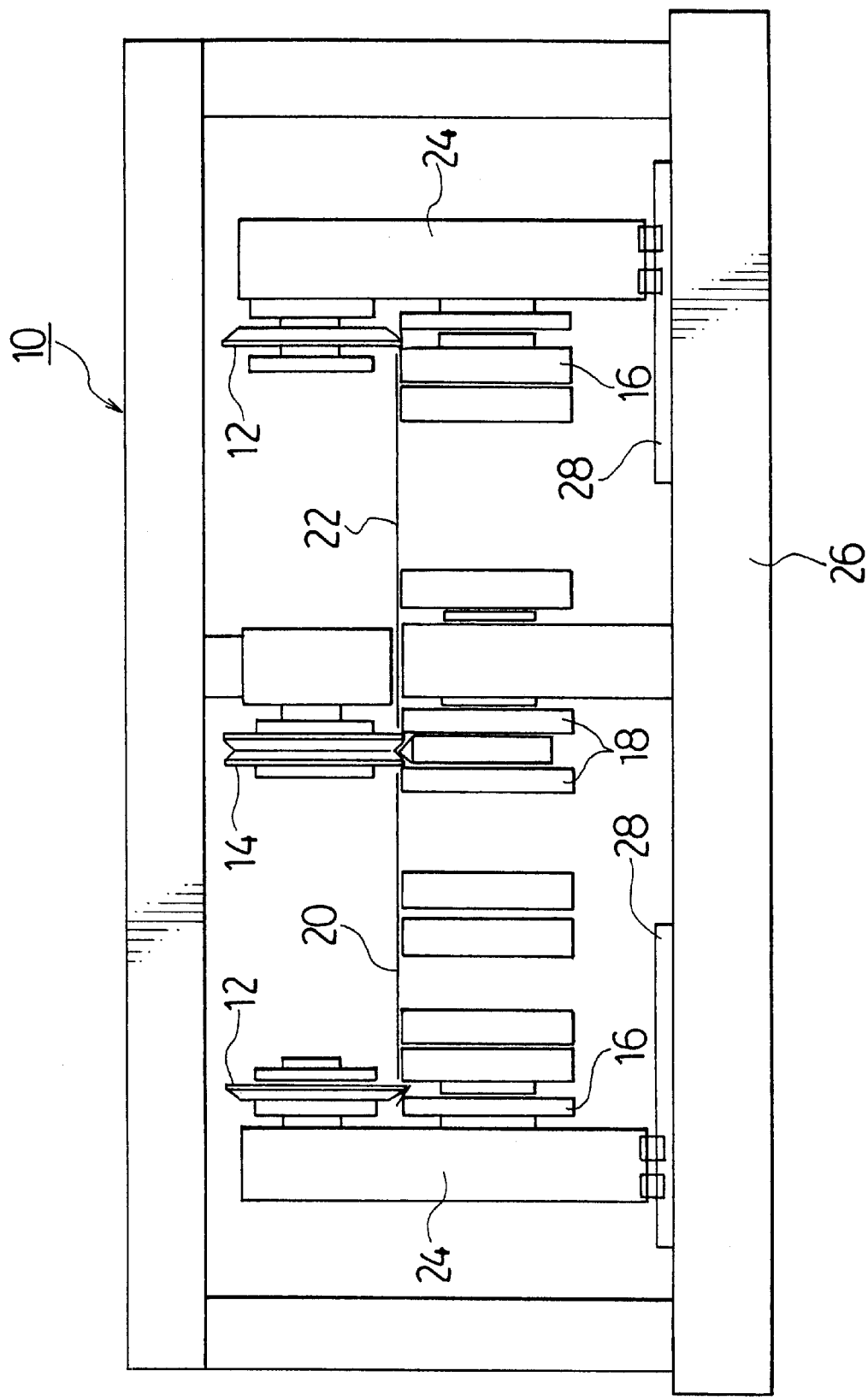

F I G. 7
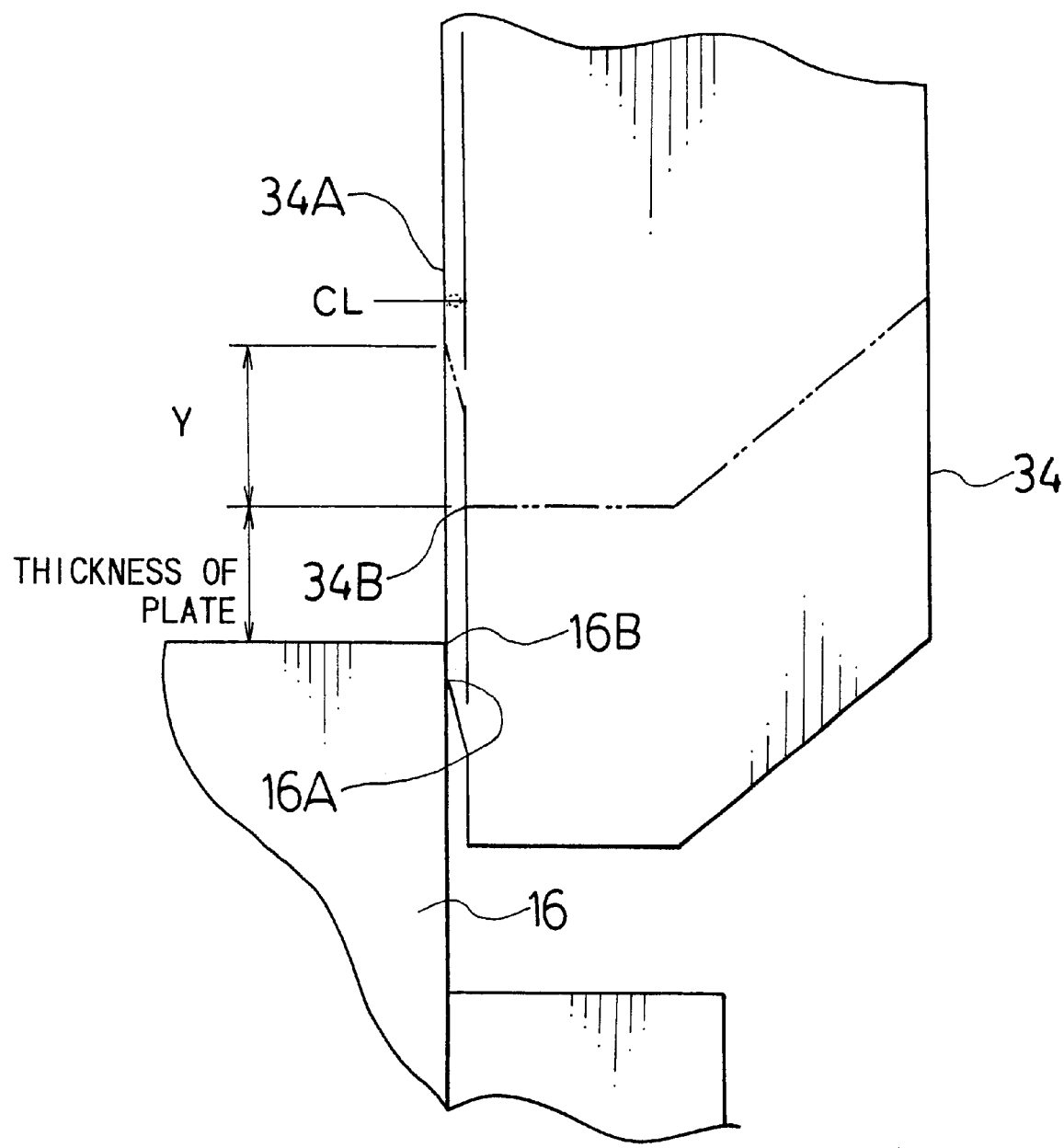

F I G. 8

| CLEARANCE (μm) | DROOP HEIGHT (μm) | BURR HEIGHT (μm) | ROUGHNESS OF CUT SURFACE ||||| EVALUATION OF FRAME STAIN | EVALUATION OF BURR HEIGHT |
| --- | --- | --- | --- | --- | --- | --- | --- | --- | --- |
| | | | MAXIMUM HEIGHT OF ROUGHNESS OF SHEARING SURFACE (μm) | MAXIMUM HEIGHT OF ROUGHNESS OF TORN SURFACE (μm) | RATIO OF CUT SURFACE || AVERAGES OF MAXIMUM HEIGHT (μm) | | |
| | | | | | SHEARING SURFACE / CUT SURFACE | TORN SURFACE / CUT SURFACE | | | |
| 0 | 10~20 | 5 | 0.1 | — | 1 | 0 | 0.1 | × | ○ |
| 30 | 20~35 | 5 | 0.2 | 5 | 0.3 | 0.2 | 1.2 | △ | ○ |
| 45 | 40~55 | 10 | 0.3 | 8 | 0.7 | 0.3 | 2.6 | ○△ | ○ |
| 55 | 50~65 | 15 | 0.5 | 12 | 0.5 | 0.5 | 6.3 | ○ | ○ |
| 70 | 60~75 | 30 | 0.8 | 8 | 0.3 | 0.7 | 5.8 | ○ | ○ |
| 100 | 85~100 | 50 | 0.8 | 15 | 0.2 | 0.8 | 12.2 | ○ | ○ |
| 120 | 110~125 | 70 | 0.8 | 12 | 0.2 | 0.8 | 9.8 | ○ | × |

FIG. 9

| ROUGHNESS OF EDGE KNIFE | ROUGHNESS OF CUT SURFACE ||||| EVALUATION OF FRAME STAIN | EVALUATION OF CHIP APPEARANCE |
| --- | --- | --- | --- | --- | --- | --- | --- |
| | MAXIMUM HEIGHT OF ROUGHNESS OF SHEARING SURFACE ($\mu m$) | MAXIMUM HEIGHT OF ROUGHNESS OF TORN SURFACE ($\mu m$) | RATIO OF CUT SURFACE || AVERAGES OF MAXIMUM HEIGHT ($\mu m$) | | |
| | | | SHEARING SURFACE / CUT SURFACE | TORN SURFACE / CUT SURFACE | | | |
| 0.1 S | 0.05 | 4 | 0.8 | 0.2 | 0.8 | × | ○ |
| 0.8 S | 0.2 | 5 | 0.8 | 0.2 | 1.2 | △ | ○ |
| 1.5 S | 1.5 | 7 | 0.8 | 0.2 | 2.6 | ○ | ○ |
| 3.0 S | 2.5 | 15 | 0.8 | 0.2 | 12.6 | ○ | × |

F I G. 1 0
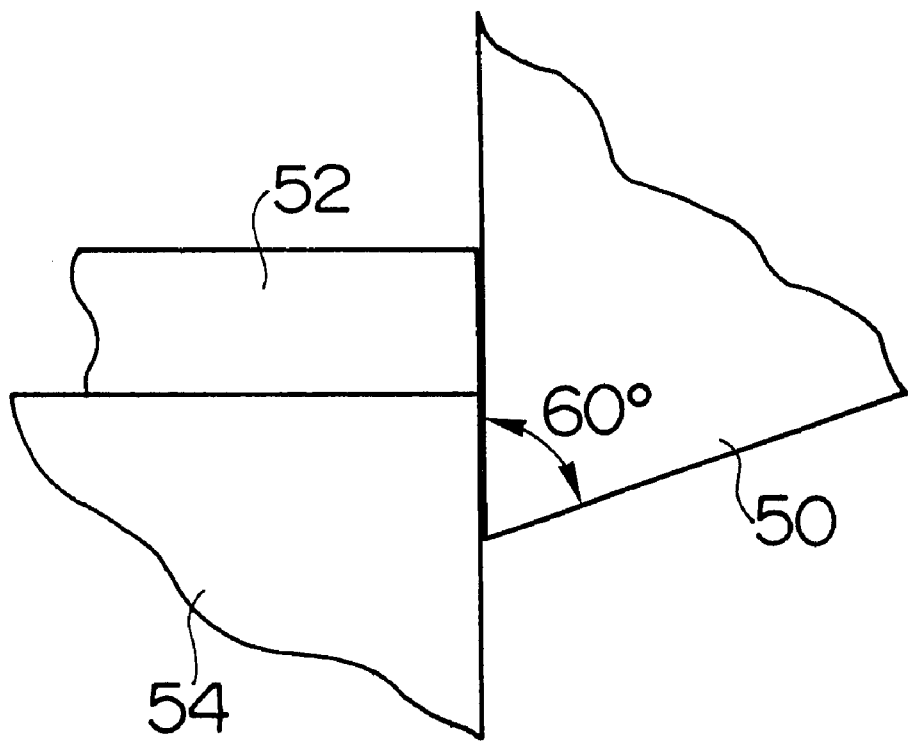
F I G. 1 1
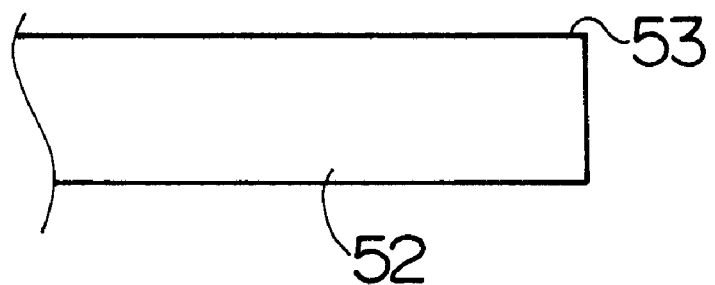

FIG. 21

| SAMPLE NO. | CUTTING CONDITIONS | | PLATE SHAPE | | | | EVALUATION OF PRINTING | |
|---|---|---|---|---|---|---|---|---|
| | KNIFE SHAPE | CLEARANCE (μm) | DROOP HEIGHT (μm) | DROOP WIDTH (μm) | CRACK POSITION (μm) | BURR ON BOTTOM FACE (μm) | FN-2 | FN-6 |
| 1 | A | 0 | 5 | 10 | — | 5 | × | × |
| 2 | B | 0 | 15 | 40 | 0~40 | 5 | × | × |
| 3 | B | 25 | 17 | 75 | 10~60 | 5 | × | △× |
| 4 | B | 30 | 30 | 50 | 25~50 | 7 | △ | ○△ |
| 5 | C | 30 | 40 | 75 | 25~75 | 7 | ○△ | ○ |
| 6 | B | 55 | 60 | 150 | 30~150 | 15 | ○△ | ○ |
| 7 | C | 55 | 70 | 160 | 25~160 | 15 | ○△ | ○ |
| 8 | D | 55 | 100 | 210 | 0~200 | 15 | △× | △ |
| 9 | B | 100 | 90 | 180 | 50~180 | 50 | ○△ | ○ |
| 10 | C | 100 | 100 | 200 | 30~200 | 50 | ○△ | ○ |
| 11 | D | 100 | 120 | 250 | 0~200 | 50 | △× | △ |

FIG. 22

| SAMPLE NO. | CUTTING CONDITIONS | | PLATE SHAPE | | | | EVALUATION OF PRINTING | |
|---|---|---|---|---|---|---|---|---|
| | KNIFE SHAPE | CLEARANCE (μm) | DROOP HEIGHT (μm) | DROOP WIDTH (μm) | SHAPE OF REVERSE SIDE (μm) | CRACK POSITION (μm) | FN-2 | FN-6 |
| 6 | B | 55 | 60 | 150 | 30~150 | | ○△ | ○ |
| 12 | E | 0 | 100 | 600 | BENT DOWNWARD | 650~550 | × | △ |
| 13 | E | 0 | 100 | 600 | HORIZONTAL | 650~550 | △ | ○△ |
| 14 | E | 0 | 100 | 600 | FIVE DEGREES UPWARD | 650~550 | △ | ○△ |

METHOD AND APPARATUS FOR MANUFACTURING SENSITIZED PRINTING PLATE

BACKGROUND OF THE INVENTION

1. Field of the Invention

The present invention relates generally to a method and apparatus for manufacturing a sensitized printing plate, and more particularly to a method and apparatus for cutting a sensitized printing plate, which can improve a printed matter, and the sensitized printing plate which is cut in the above-mentioned method and apparatus.

2. Description of Related Art

A sensitized printing plate is widely used as a pre-sensitized plate (PS plate). To manufacture the PS plate, surface treatment such as graining, anodic oxidation and chemical conversion coating are, singly or in combination, generally performed on the surface of a sheet-shaped or coil-shaped aluminum plate. Then, a sensitive solution is coated on the plate and the plate is dried, and the plate is cut into a desired size.

On the other hand, as an example of printing by means of the printing plate, which is made by image-sensitizing and developing the PS plate, a printing machine prints paper which is smaller than the printing plate, and paper which is wider than the printing plate as newspaper's printing. In the case of the latter, the both surfaces of the printing plate are used to be printed. For this reason, ink on a cut end of the printing plate is printed on the printed paper. As a result, a printed matter is ruined and its merchandise value can be lowered.

In order to prevent the printed paper from getting stained by the ink on the cut end of the printing plate, for example, Japanese Patent Publication No. 57-46754 has disclosed a method which files a corner of the end of the aluminum base plate with a file, a knife, etc., and Japanese Patent Publication No. 62-61946 has disclosed a method which coats an oil-insensitive solution on a cut surface.

In addition, Japanese Patent Provisional Publication No. 62-19315 has disclosed a method which prevents a burr from forming on the printing surface because the burr makes stains on the printed paper. Furthermore, Japanese Patent Provisional Publication No. 7-32758 has proposed that the cut end is bent to the reverse side of the printing surface, and Japanese Patent Application No. 8-192079 has disclosed a method which hangs the surface of the cut end on the reverse side of the printing surface, and roughs the side surface so as to decrease the stain of the printed paper.

However, the above-mentioned method, which shaves the corner of the end of the base plate with a file or a knife, is not suitable for a mass production. Moreover, a burr is cut, the ink may be put on the filed part, and thereby the ink can stain the printed paper. The method which coats the oil-insensitive solution on the cut surface also has a disadvantage because the printing plates stick to one another and the development cannot be satisfactorily carried out.

Even if the burr is prevented from forming on the printed paper during cutting, the surface is stained under some conditions. Although the stain on the cut end which is bent down (to the reverse side of the printing surface) can be decreased, it may get stuck while it is transferred in a printing machine which exposes an image.

Magenta ink, etc. can stain a sample a long time after the cutting. If a shear droop is formed on the cut end surface so as to prevent the stain caused by the ink, a surface layer extends, and a crack is generated on a sensitized layer and the surface of the sensitized printing plate.

Japanese Patent Provisional Publication No. 5-104872 discloses that the crack on a surface treatment layer causes the stain; however, the Patent Provisional Publication does not disclose about decreasing the stain caused by the crack among the frame-shaped stain on the printing surface of the plate.

SUMMARY OF THE INVENTION

The present invention has been developed in view of the above-described circumstances, and has its object the provision of a sensitized printing plate and a method and apparatus for manufacturing it, which can prevent the ink on the cut end from staining the printed paper in the form of frame and which can prevent the printing surface from staining due to the crack appearing during the cutting regardless of the ink type and the time passage.

To achieve the above-mentioned object, the present invention is a sensitized printing plate in which a sensitive layer is formed on a metallic base plate provided with a hydrophilic surface, and the sensitized printing plate is characterized in that shear droops are 20 to 100 $\mu$m at the end of opposite two or four sides of the base plate, and that the average of maximum height of roughness of a cut surface is between 1.2 $\mu$m and 12 $\mu$m. The maximum height average of the roughness of the cut surface is a value, which is obtained by a summation average of the maximum height of each roughness of the two surfaces (a shearing surface sheared with a knife, and a torn surface caused by a crack which is generated) which appear on the cut surface, by the ratio of the shear ed surface and the torn surface to the cut surface at the maximum height. If the average is refereed to as S, then S=roughness of sheared surface×(sheared surface/cut surface)+roughness of torn surface×(torn surface/cut surface).

Moreover, to achieve the above-mentioned object, the present invention is the method and apparatus for cutting the sensitized printing plate in which the sensitive layer is formed on the metallic base plate provided with the hydrophilic surface, and in the method and apparatus, a clearance between an upper knife and a lower knife for cutting the sensitized printing plate in a predetermined size is set at between 30 $\mu$m and 100 $\mu$m.

In the present invention, the shear droop at the cut end of the sensitized printing plate is 30 to 100 $\mu$m high and 0.1 to 0.3 mm wide, and the burr at the bottom (the surface which is not printed) is less than 50 $\mu$m. The maximum height of the roughness of the cut surface is 1.2 to 12 $\mu$m on the average, and a hydrophilic property is improved, and the frame-shaped stain can be decreased.

As the height of the shear droop increases, the frame-shaped stain can be decreased. When the height of the burr exceeds 100 $\mu$m, the height of the burr at the bottom exceeds 50 $\mu$m. Thus, the flatness of the sensitized printing plate deteriorates when the sensitized printing gate is mounted in a rotary press. Thereby, the printing is badly effected. If the maximum height of the surface roughness of the cut surface is about 0.1 $\mu$m, the satisfactory hydrophilic property cannot be acquired, or the frame-shaped stain cannot be decreased. In order to rough the cut surface, the clearance is expanded, and the surface of a knife is roughed. If, however, the conditions are excessively changed, there are the following disadvantages. If the clearance exceeds 100 $\mu$m, the large burr may appear, and if the surface roughness of the knife is more than 3S (surface roughness value determined by JIS, which is the abbreviation for Japanese Industrial Standard), the chips may appear, or the like.

In order to obtain the satisfactory cut surface by a slitter using a rotary flat knife, the clearance in an axial direction between the upper knife and the lower knife is wider than 5 to 10% of the plate thickness, which is generally regarded as the optimum condition. For example, the clearance is between 30 $\mu$m and 100 $\mu$m, if the plate thickness is 0.3 mm. The surface of the knife is preferably finished to be about 0.4S. If a Gabel type slitter is used in which the upper knife and the lower knife are pressed by a spring and there is no clearance, the above-mentioned cut surface is obtained by providing the tool of the upper knife or lower knife with a notch of between 30 $\mu$m and 100 $\mu$m.

To achieve the above-mentioned object, the present invention is a method of manufacturing the sensitized printing plate in which the sensitive layer is formed on the metallic base plate provided with the hydrophilic surface, and in this method, the clearance between the upper knife and the lower knife for cutting the sensitized printing plate is between 30 $\mu$m and 100 $\mu$m so that, when the sensitized printing plate is cut, the crack appears at a position which is more than 25 $\mu$m inward from the end of the sensitized printing plate.

According to the present invention, an experiment confirmed that the stain is caused by a crack which appears at a position which is less than 25 $\mu$m inward from the end of the sensitized printing plate. In order to prevent the stain caused by the crack, the clearance between the upper and lower knives for cutting the sensitized printing plate is between 30 $\mu$m and 100 $\mu$m so that the crack can appear at a distance of more than 25 $\mu$m from the end of the sensitized printing plate. Thereby, the present invention can prevent the stain caused by the crack which appears during the cutting.

In the process of forming the anodic oxidation coating on the surface of the sensitized printing plate, the quantity of coating is between 1.5 $\mu$/m$^2$ and 3.5 g/m$^2$, and the sensitized printing plate is deformed so that the height of the shear droop at the end of the opposite two or four sides of the sensitized printing plate can be between 20 $\mu$m and 100 $\mu$m. The crack, etc. at the shear droop are positioned at a distance of more than 25 $\mu$m inward from the end of the sensitized printing plate. The amount of the height of the shear droop can be determined to be the same by determining the clearance between the upper knife and the lower knife which should be 30 $\mu$m to 100 $\mu$m. Moreover, if the cracks, etc. on the surface are processed to become insensitive to oil, the adhesion of the ink can be prevented or controlled, and if the above-mentioned means for preventing the crack stain during the printing is additionally used, the frame-shaped stain can be prevented without fail regardless of the ink and the passing of time.

In the cutting method disclosed by Japanese Patent Application No. 8-192079, the shear droop can be formed at the end of the plate, and the ink is difficult to adhere to the end of the print. Thereby, the linear frame-shaped stain (hereinafter referred to as "linear stain") can be decreased. On the other hand, since the shear droop is formed and the sensitive layer on the plate and the surface layer on the sensitized printing plate are expanded and deformed, the crack, etc. appear on the surface. A new surface, which results from the crack, is stained with the passing of time, and the lipophilic property is increased, and the ink is easily adhered to the new surface. In particular, the crack stain depends on the position of the crack. If the cracks center on the end of the plate or in a proximity to a point M on the surface 3 in the case where the bottom surface 2 of the sensitized printing plate 1 sticks out as shown in FIG. 20. On the other hand, when the shape of the knife and the quantity of the surface anodic oxidation coatings were optimized so that the shear drooping could not center on one particular part, and the cracks whose largest opening width was more than 0.5 $\mu$m were diffused on the plate at more than 25 $\mu$m with no crack at a distance of less than 25 $\mu$m, and the stain decreased. More preferably, when the area which is less than 25 $\mu$m from the end was processed so as to become insensitive to oil and avoid the stain which might be caused with the passing of time, the crack stain did not appear even in the printing by means of the ink which had a high possibility of causing the crack stain. The frame-shaped stain can be significantly reduced by preventing the crack stain as well as the linear stain resulting from the shear drooping.

On the other hand, the sensitive layer on the sensitized printing plate of the present invention is, for example, a negative sensitive composition which is composed of diazo resin and hydrophobic resin; positive sensitive composition composed of o-quinonediazido compound and novolak resin; photopolymerization compounds which are composed of addition polymerization unsaturated monomer, photopolymetrization initiator and organic high polymer compound as binder; or composition which has a combination of —CH=CH—CO— in a molecule and sensitive resin which causes a photo-crosslinking reaction.

A typical example of the negative sensitive composition includes diazo resin and a bonding agent. A typical example of the diazo resin is a condensate of aromatic diazonium salt and activated carbonyl group including compound, e.g. hormaldehyde.

The diazo resin is, for example, organic solvent soluble diazo resin inorganic salt, which is a reactive product from a condensate of p-diazodiphenylamine and aldehyde such as hormaldehyde and acetaldehyde and hexafluoro phosphoric acid or tetrafluoro boric acid; or organic solvent soluble diazo resin organic salt which is a reactive product between the condensate of Japanese Patent Publication No. 47-1167 and organic solvent soluble diazo resin organic salt such as p-toluenesulfonate or its salt, propylnaphthalenesulfonate or its salt, butylnaphthalenesulfonate or it salt, dodecylbenzenesulfonate or its salt, and 2-hydroxy-4-methoxybenzophenone or its salt. In particular, high molecular diazo compound of Japanese Patent Provisional Publication No. 59-78340, which includes more than 20% by mole of hexamer or over.

Moreover, it is possible to use mesitylene sulfonate which is a condensate of 3-methoxy-4-diazo-diphenylamine and 4,4'-bis-methoxy-methyl-diphenyl ether as indicated in Japanese Patent Provisional Publication No. 58-27141.

Furthermore, a copolycondensate is preferably used, and the coplycondensate includes, as its unit, aroma compound which has at least one of carboxyl group, sulfonic acid group, sulfonic acid group, phosphorus oxygen acid group and hydroxyl group, and diazonium compound, more preferably, aroma diazonium compound.

The bonding agent includes acid of from 0.1 to 3.0 meq/g, more preferably, from 0.2 to 2.0 meq/g. The bonding agent is a high polymer compound which is substantially water-insoluble (that is, insoluble in neutral or acid aqueous solution) and tends to form the film. The bonding agent preferably dissolves or swells in developing solution of alkaline aqueous solution, and hardens with light in a state of being combined with the sensitive diazo resin and does not dissolve or swell in the developing solution. The development is difficult when the quantity of acid content is less than 0.1 meq/g, and when the acid content exceeds 3.0 meq/g, the intensity of the image is significantly low during the development.

More particularly, the bonding agent is preferably copolymer which includes as its essential component acrylic acid, methacrylic acid, crotonic acid, or maleic acid: for example, copolymer of 2-hydroxyethylacrylate, 2-hydroxyethylmethacrylate, acrylonitrile or methacrylonitrile, acrylic acid or methacrylic acid, and other monomer which is able to copolymerize, as mentioned in Japanese Patent Provisional Publication No. 50-118802; copolymer of acrylic acid or methacrylic acid whose end group is a hydroxy group and is esterified by a group including a remained group of dicarboxylic acid ester, acrylic acid or methacrylic acid and other monomer which is able to coplymirize, as mentioned in Japanese Patent Provisional Publication No. 53-120903; copolymer of monomer (e.g. N-(4-hydroxyphenyl) methacrylic amide), acrylic acid or methacrylic acid, and other monomer which is able to polymerize, as mentioned in Japanese Patent Provisional Publication No. 54-98614; and polymer of alkylacrylate, acrylonitrile or methacrynitrile, and unsaturated carboxylic acid, as mentioned in Japanese Patent Provisional Publication No. 56-4144. Moreover, polyvinylalcohol derivative acid and cellulose derivative acid can be used, too. Further, bonding agent which is obtained by polyvinyl acetal and polyurethan as mentioned in Japanese Patent Publication No. 54-19773, Japanese Patent Provisional Publication Nos. 57-94747, 60-182437, 62-58242 and 62-123453 may also be used. In addition, the polymer, which has a maleimide group in a side chain of the polymer and is polymerized as a network by the light as mentioned in Japanese Patent Publication No. 5-2227 may also be used.

Regarding the content of the diazo resin and the bonding agent in the sensitive layer on the sensitized printing plate, the diazo resin is preferably from 3 to 30% by weight, and the bonding agent is preferably from 97 to 70% by weight in view of the total amount of the two. If the content of the diazo resin is small, the sensitivity is high; however, the content of less than 3% by weight is not enough to harden the bonding agent by light. The light hardening film swells in the developing solution during the development, and the film gets weakened. To the contrary, if the content of the diazo resin is more than 30% by weight, the sensitivity is low. Thus, the content of the diazo resin is more preferably from 5 to 25% by weight, and the bonding agent is more preferably from 95 to 75% by weight.

The sensitized compound in the positive sensitized composition is o-quinonediazide compound for example, and a typical example of the sensitized compound is o-naphthoquinonediazide compound.

The o-quinonediazide compound is preferably ester of 1,2-diazonaphthoquinonesulfonate chloride and pyrogallolacetone as taught in Japanese Patent Provisional Publication No. 43-38403. Moreover, the o-quinonediazide compound is ester of 1,2-diazonaphtoquinone-5-sulfonatechloride and phenol-hormaldehyde resin as mentioned in U.S. Patent Nos. 3,046,120 and 3,188,210, and ester of 1,2-diazonaphthoquinone-4-sulfonatechloride and phenol-hormaldehyde resin as mentioned in Japanese Patent Provisional Publication Nos. 2-96163, 2-96165 and 2-96761. Other examples of o-naphthoquinonediazide compound are described in Japanese Patent Provisional Publication Nos. 47-5303, 48-63802, 48-63803, 48-96575, 49-38701 and 48-13354; Japanese Patent Publication Nos. 37-18015, 41-11222, 45-9610 and 49-17481; U.S. Pat. Nos. 2,797,213, 3,454,400, 3,544,323, 3,573,917, 3,674,495 and 3,785,825; U.K. Patent Nos. 1,227,602, 1,251,345, 1,267,005, 1,329, 888 and 1,330,932; and German Patent No. 854,890, etc.

Furthermore, in the present invention, polymer compound which has orthonitrocarbinolester group may also be used as the sensitive compound which acts positive without using o-naphthoquinoneazide compound. The above-mentioned polymer compound is mentioned in Japanese Patent Publication No. 56-2696.

In addition, in the present invention, a combination of a compound, which generates acid as a result of photolysis and a compound which has a —C—O—C group or —C—O—Si group which is dissolved by acid.

For example, a compound which generates acid as a result of photolysis is combined with an acetal or an O,N-acetal compound (Japanese Patent Provisional Publication No. 48-89003); with orthoester or amidacetal (Japanese Patent Provisional Publication No. 51-120714); with polymer which has an acetal group or a ketal group in a principal chain (Japanese Patent Provisional Publication No. 53-133429); with an enolether compound (Japanese Patent Provisional Publication No. 55-12995); with an N-acylimino carbon compound (Japanese Patent Provisional Publication No. 55-126236); with polymer which has an orthoesther group in a principal chain (Japanese Patent Provisional Publication No. 56-17345); an silylester compound (Japanese Patent Provisional Publication No. 60-10247) and an silylether compound (Japanese Patent Provisional Publication Nos. 60-37594 and 60-121446).

In the present invention, the sensitive substance for the sensitive composition has as its main component the sensitive polymer such as polyester, polyamide and polycarbonate which include a sensitive group of —CH=CH—CO— in a principal or side chain of the polymer. For example, the sensitive polymer is, as mentioned in Japanese Patent Provisional Publication No. 55-40415, sensitive polyester which is a condensate of phenylenediethyl acrylate and bisphenol A, which has hydrogen added, and triethyleneglycol, and as mentioned in U.S. Pat. No. 2,956, 878, sensitive polyester which is induced from (2-propenylidene) malonic acid compound such as cinnamylidene malonic acid and bifunctional glycol.

Furthermore, in the present invention, an aromatic azido compound in which an azido group is connected to an aromatic ring directly or via a carbonyl group or sulfonyl group may be used as the sensitive substance for the sensitive composition. For example, the azido compound is polyazidostyrene, polyvinyl-p-azidobenzoate and polyvinyl-p-azidobenzal in U.S. Pat. No. 3,096,311; an reaction product of azidoallylsulfonylchloride and unsaturated hydrocarbon polymer in Japanese Patent Publication No. 45-9613; and polymer which has sulfonylazido and carbonylazido as mentioned in Japanese Patent Publication Nos. 43-21067, 44-229, 44-22954 and 45-24915.

Furthermore, in the present invention, the photo polymer composition, which is composed of addition polymerization unsaturated compound, may be used as the sensitive composition for the sensitive composition. The present invention may be applied to a sensitive composition which is used for an electrophotogrpahic printing plate: for example, a sensitive composition which is composed of an electron donative compound used for a electrophotographic printing plate, phthalocyanine pigment and phenol resin as mentioned in Japanese Patent Provisional Publication No. 55-161250.

The sensitive composition dissolves in the coating solvent, and the aluminum base plate which has a hydrophilic surface is coated with the sensitive composition, so that the weight of the dried coating can be from 0.3 to 5.0 g/m² and more preferably from 0.5 to 3.0 g/m². During the coating, the density of solid matter in the sensitive composition is preferably from 1.0 to 50% by weight, and more preferably from 2.0 to 30% by weight. As a method of coating the sensitive composition on the base plate, the following methods may be used: roll coating, bar coating, spray coating, curtain coating, rotation coating, etc. The coated sensitive composition solution is dried at preferably from 50 to 150° C. The composition may be dried at a low temperature first, and then at a high temperature. The composition may also be dried at a high temperature from the beginning.

The base plate is preferably aluminum or a composite base plate covered with aluminum, and more preferably an IS aluminum plate which includes iron of from 0.1 to 0.5% by weight, silicon of from 0.03 to 0.3% by weight, copper of from 0.001 to 0.03% by weight and titanium of from 0.002 to 0.1% by weight.

The surface of the aluminum plate is preferably treated so as to improve the water retentivity and adhesion with the sensitive layer. The aluminum plate may be immersed and etched in alkali or aqueous solution such as 1 to 30% by weight sodium hydroxide solution, potassium hydroxide solution, sodium carbonate solution and sodium silicate solution for 5 to 250 seconds at 20 to 80° C. Aluminum ion which is about ⅕ of the alkali may be added to the etching bath. Then, the aluminum material is immersed in nitric acid or sulfuric acid solution of 10 to 30% by weight at 20 to 70° C. for 5 to 25 seconds so that neutralization and desmutting can be performed. Examples of a surface roughing method are a well-known brush graining method, marbleing, electrolytic etching, chemical etching, solution honing, sand blasting, and a combination of them, and more preferably, brush graining method, electrolytic etching, chemical etching and solution honing. The surface roughing method which includes the electrolytic etching is particularly preferable. Moreover, as disclosed in Japanese Patent Provisional Publication No. 54-63902, the electrolytic etching after brush graining is also preferable.

Furthermore, the electrolytic bath which is used for the electrolytic etching is a solution which includes acid, alkali or salt of them, or an aqueous solution which includes organic solvent, and the electrolyte including hydrochloric acid, nitric acid or salt from them is particularly preferable.

The brush graining is preferably combined with a pumice stone water suspension and nylon brush, and the average of the surface roughness is preferably from 0.25 to 0.9 μm.

The electrolyte used for the electrolytic etching is hydrochrolic or nitric acid solution, and the density of the electrolyte is preferably from 0.01 to 3% by weight, and more preferably from 0.05 to 2.5% by weight.

The above-mentioned electrolyte may include a corrosion inhibitor (or stabilizer) such as nitrate, chloride, monoamine, diamine, aldehyde, phosphoric acid, chromic acid, boric acid and ammonium oxalate salt, and a sand homogenizer. The electrolyte may also include an appropriate amount (1–10 g/l) of aluminum ion.

The electrolytic etching process is usually executed with the electrolyte at 10 to 60° C. In this case, an alternate current may be of rectangular wave, trapezoidal wave or sine wave, if the polarity of positive and negative is alternated, and a normal single phase and three-phase alternating current may be used. The process is preferably performed for 10 to 300 seconds with the current density at 5–100 A/dm².

In the present invention, the surface roughness of the aluminum alloy base plate is adjusted according to the electricity over a range of 0.2 to 0.8 μm.

The aluminum plate, whose surface has been roughed, is desmut in acid or alkaline solution if necessary.

After the aluminum alloy is roughed, the smut adhered to its surface is removed or the aluminum alloy is etched in heat sulfuric acid of 10 to 50% by weight (40–60° C.) or thin alkali (e.g. sodium hydroxide) (preferably over a range of 0.01 to 2.0 g/m²). If the desmutting and the etching are performed using the alkali, the aluminum alloy is immersed and washed in acid (nitric acid or sulfuric acid) so as to neutralize the alkali.

After desmutting the surface, the anodic oxidation coatings are formed. The well-known method may be used for the anodic oxidation; however, the sulfuric acid is the best for the electrolyte, and phosphoric acid is also suitable. In addition, mixed acid of the sulfuric acid and the phosphoric acid, which is disclosed in Japanese Patent Provisional Publication No. 55-28400, may also be used.

The sulfuric acid method is normally executed using a direct current; however, an alternating current may also be used. The electrolytic treatment is performed for 5 to 250 seconds over a temperature range of 20 to 60° C. with the sulfuric acid density ranging from 5 to 30% by weight. The anodic oxidation coatings of 1 to 10 g/m² are formed on the surface. The electrolyte preferably includes aluminum ion, and the current density is preferably 1 to 20 A/dm².

If the phosphoric acid is used, the electrolytic treatment is performed for 10 to 300 seconds over a temperature range of 30 to 60° C., with the phosphorus acid density ranging from 5 to 50% by weight and the current density ranging from 1 to 15 A/m².

In addition, as the need arises, the following methods can be used: silicate (sodium silicate and potassium silicate) treatment in U.S. Pat. Nos. 2,714,066 and 3,181,461; potassium fluorozirconate treatment in U.S. Pat. No. 2,946,638; phosphomolybdenum treatment in U.S. Pat. No. 3,201,247; alkyltitanate treatment in U.K. Patent No. 1,108,559; polyacrylate treatment in German Patent No. 1,091,433; polyvinyl phosphoric acid treatment in German Patent No. 1,134,093 and U.K. Pat. No. 1,230,447; phytic acid treatment in U.S. Pat. No. 3,307,951; and treatment using salt of a hydrophilic organic macromolecule compound and divalent metal in Japanese Patent Provisional Publication Nos. 58-16893 and 58-18291. In these methods, the aluminum alloy is preferably treated to be hydrophilic by undercoating a aqueous polymer which has a sulfonic acid as mentioned in Japanese Patent Provisional Publication No. 59-101651, or the aluminum alloy is colored by acid dyestuff as mentioned in Japanese Patent Provisional Publication No. 60-64352.

Moreover, silicate electrodeposition, which is described in U.S. Pat. No. 3,658,662, may be performed for the hydrophilic treatment.

After the graining and the anodic oxidation, the aluminum alloy is preferably sealed. The aluminum is immersed in a hot aqueous solution including inorganic or organic salt or bathed in steam.

Furthermore, the aluminum supporting plate may be undercoated.

Examples of compounds to be used for undercoating are as follows: carboxymethyl cellulose; dextrin; acacia; phosphoric acid which has an amino group such as 2-aminoethylphosphonic acid; organic phosphoric acid such as phenylphosphonic acid, naphthylphosphonic acid, Alkylphosphomic acid, glycerophosphonic acid, methylenediphosphonic acid, and ethylenediphosphonic acid, all of which may have a substituent; amino acid such as glysine and β-alanine; hydrochloride of amine such as triethanolamine which has a hydroxyl group; aqueous polymer which has a sulfonic acid group as mentioned in Japanese Patent Provisional Publication No. 59-101651; and acid coating as mentioned in Japanese Patent Provisional Publication No. 60-64352.

The above-mentioned compounds, which are dissolved in water, methanol, ethanol, methylethylketone, or these mixed solvent, are coated on the supporting plate and dried. A yellow dyestuff may be added so as to improve the tone reproducibility on the sensitized printing plate.

After the undercoatings are dried, the amount of coatings is preferably 2 to 200 mg/m$^2$, and more preferably 5 to 100 mg/m$^2$.

A matt layer is preferably provided on the sensitive layer, and the matt layer is composed of independently-formed projections. The matt layer is provided in order to improve the vacuum adhesiveness between the negative image film and the sensitized printing plate in a contact exposure, thereby reducing a vaccuumizing time and preventing a fine dot from collapsing during the exposure.

There are a variety of matt layer coating methods as follows: a method of heat-sealing solid powder which has been powdered as mentioned in Japanese Patent Provisional Publication No. 55-12974 and a method of spraying water including polymer and drying the water as mentioned in Japanese Patent Provisional Publication No. 58-182636. Both methods can be used. The matt layer is preferably composed of substances which are soluble in an aqueous developing solution which includes substantially no organic solvent, or substances which can be removed by the above-mentioned aqueous developing solution.

The sensitized printing plate, which is provided with the sensitive composition layer having been coated on the roughed aluminum plate and dried, is developed by an alkaline developing solution after the exposure of the image, so that a relief image can be obtained. A carbon arc lamp, a mercury lamp, a xenon lamp, a metal halide lamp, a strobe, ultraviolet rays and laser rays are suitable as a light source used for exposure.

The alkali developing solution, which is used for developing the negative sensitized printing plate, preferably includes water of more than 75% by weight with pH at 8 to 13 as mentioned in Japanese Patent Provisional Publications Nos. 51-77401, 51-80228, 53-44202 and 55- 52054. If necessary, the following may be added: an organic solvent whose solubility is less than 10% by weight at room temperature (e.g. benzyl alcohol, ethylene glycol monophenyl ether), alkali agent (e.g. triethanolamine, diethanolamine monoethanolamine, sodium phosphate, sodium carbonate), anion surface active agent (e.g. aromatic sulfonate, dialkylsulfosuccinate, alkylnaphthalene sulfonate, fatty acid chloride, alkylsulfate), Nonion surface active agent (e.g. polyoxyethylenealkylether, polyoxyethylenealkylalrylether, polyoxyethylenepolyoxypropyleneblockpolymer), staining prevention agent (e.g. sodium sulfite, natrium salt of sulfopyrazolonel) and water softening agent (ethylenediaminetetra acetyl 4-natrium salt, nitro-3-acetate-3-natrium salt).

If the organic solvent, etc. are added, there are the following problems: a sanitary problem such as toxicity and smell during working hours, a safely problem such as fire and gas explosion, a working problem such as generation of bubbles, a pollution problem such as waste water, and a cost problem. The developing solution preferably includes substantially no organic agent.

The alkali developing solution which does not include organic agent is, for example, a developing solution composition which is used for development after the exposure of the images on the positive sensitized printing plate as mentioned in Japanese Patent Provisional Publication Nos. 59-84241, 57-192952, and 62-24263.

The sensitized printing plate of the present invention may be processed by methods disclosed in Japanese Patent Provisional Publication Nos. 54-8002, 55-115045, and 59-58431. That is, after the development, the oil-insensitive treatment may be performed after washing in water, the oil-insensitive treatment may be performed first, or the oil-sensitizing treatment may be performed after the treatment using the aqueous solution including acid.

Moreover, in the process of developing the sensitized printing plate, as the alkali aqueous solution is wasted according to the throughput, the alkali concentration is decreased. Or, the alkali concentration is decreased by air as the automatic developing machine is operated for many hours. In this case, as mentioned in Japanese Patent Provisional Publication No. 54-62004, the processing capacity may be restored by means of replenisher. In this case, the replenisher is used as described in U.S. Pat. No. 4,882,246.

The above-mentioned processing is preferably executed by an automatic developing machine mentioned in Japanese Patent Provisional Publication Nos. 2-7054 and 2-32357.

The oil-insensitive gum which is coated as desired in a final step in the printing process is preferably one as mentioned in Japanese Patent Publication Nos. 62-16834, 62-25118, 63-52600, Japanese Patent Provisional Publication Nos. 62-7595, 62-11693, and 62-83194.

After the development, if it is necessary, an unnecessary part in the image may be erased by an erasing solution on the market or by a stone rod.

The developing solution which is used for developing the positive sensitized printing plate is preferably the alkali aqueous solution which includes substantially no organic solvent: for example, potassium silicate, sodium silicate, sodium hydroxide, potassium hydroxide, lithium hydroxide, sodium tertiary phosphate, sodiumtertiary phosphate, ammonium secondary phosphate, ammonium secondary phosphate, sodium metasilicate, sodium carbonate, sodium bicarbonate, potassium carbonate, potassium bicarbonate, and aqueous ammonia. The concentration of the aqueous solution is 0.1 to 10% by weight, and more preferably 0.5 to 5% by weight.

In particular, the developing solution including alkali silicate such as potassium silicate, lithium silicate and sodium silicate is preferable because it does not stain the printing plate very much during the printing. The mole ratio of the alkali silicate is preferably $[SiO_2]/[M]$=0.5 to 2.5 ($[SiO_2]$ and $[M]$ indicate the molarity of $SiO_2$ and the molarity of total alkali metal, respectively), and the developing solution preferably includes $SiO_2$ of 0.8 to 8% by weight. The developing solution may include aqueous sulfite such as sodium sulfite, potassium sulfite, magnesium sulfite; resorcin; methylresorcin; hydroquinone; and thiosalicylic acid. The inclusion of the above-mentioned compounds in the developing solution is preferably 0.002 to 4% by weight, and more preferably 0.01 to 1% by weight.

At least one of an anion surface active agent mentioned in Japanese Patent Provisional Publication Nos. 50-51324 and 59-84241, anion surface active agent, and ampho-ion surface active agent mentioned in Japanese Patent Provisional Publication Nos. 59-75255, 60-111246 and 60-213943; or high polymer electrolyte mentioned in Japanese Patent Provisional Publication Nos. 55-95946 and 56-14252 is preferably included in the developing solution, so that a property of wetting the sensitive composition can be increased, and the development stability (development latitude) can be improved. The addition of the surface active agent is preferably 0.001 to 2% by weight, and more preferably 0.003 to 0.5% by weight. The alkali metal of the alkali silicate preferably includes more than 20 mole % of kalium because insoluble matters do not appear in the developing solution. 90 mole % is more preferable, and 100 mole % most preferable.

In addition, the developing solution of the present invention may include a slight amount of organic solvent such as alcohol, chelate agent mentioned in Japanese Patent Provisional Publication No. 58-190952, metal salt mentioned in Japanese Patent Provisional Publication No. 1-30139, and antifoaming agent such as organic silane compound.

Of course, the sensitized printing plate of the present invention may be processed by methods disclosed in Japanese Patent Provisional Publication Nos. 54-8002, 55-11504 and 59-58431. That is, after the development, the oil-insensitive treatment may be performed after washing in water, the oil-insensitive treatment may be performed first, or the oil-insensitive treatment may be performed after the treatment using the aqueous solution including acid. In the process of developing the sensitized printing plate, as the alkali solution is consumed according to the throughput, the alkali concentration is decreased, or as the automatic developing machine is operated for may hours, the alkali concentration is decreased to lower the processing capacity. In this case, however, the replenisher may be used to restore the processing capacity as described in Japanese Patent Provisional Publication No. 54-62004. The replenisher is preferably used as described in U.S. Pat. No. 4,882,246. The above-mentioned processing is preferably performed by the automatic printing machine which is described in Japanese Patent Provisional Publication Nos. 2-7054 and 2-32357.

In order to erase the unnecessary part in the image after image-exposing, developing and washing or rinsing the sensitized printing plate of the present invention, an erasing solution is preferably used as mentioned in Japanese Patent Publication No. 2-13293. It is preferable to use the oil-insensitive gum, which is coated if necessary in the final step in the printing process, in Japanese Publication Nos. 62-16834, 62-25118 and 63-52600 and Japanese Patent Provisional Publication Nos. 62-7595, 62-11693 and 62-83194.

Moreover, in order to perform burning on the sensitized printing plate after image-exposing, developing, washing or rinsing, erasing if necessary, and washing it, the sensitized printing plate is preferably treated, before burning, in a surface treatment solution which is mentioned in Japanese Patent Publications No. 61-2518 and 55-28062 and Japanese Patent Provisional Publication Nos. 62-31859 and 61-159655.

COMPOSITE EXAMPLE 1

29.4 g of 4-diazophenylamine sulfate (whose purity is 99.5%) was gradually added to 70 ml of the 96%- sulfonic acid at a temperature of 25° C., and the mixture was stirred for twenty minutes. 3.26 g of paraformaldehyde (whose purity is 92%) was gradually added to the mixture for about ten minutes, and the mixture was stirred for four hours at a temperature of 30° C. so as to proceed with the condensation reaction.

The condensation mole ratio between the diazo compound and the hormaldehyde is 1:1. A reaction product was poured into ice water 21 while it is being stirred, and the reaction product was treated in concentrated cool aqueous water in which 130 g of sodium chloride was dissolved. The precipitation was filtrated under reduced pressure, and the solid which is partially dried was dissolved in 11 of water. Then, the solid was filtered, cooled by ice, and treated in aqueous water in which 23 g of potash hexafluorophosphate was dissolved. The precipitation was filtered, collected and dried by air, and 30.3 g of the high polymer diazo compound (1) was obtained as a result.

The obtained diazo compound (1) and 1-phenyl-3-methyl-5-pyrazolone were coupled in methyl collosolve, and pigment was obtained. The weight average molecular weight of the plastid was 16,500, which corresponded to approximately 45 polymers.

When the weight average molecular weight of the plastid was measured by a gel permeation chromatography (GPC), the plastid was found to include more than about 30 mole % of more than 10 polymers.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a front view illustrating a slitter for pre-sensitized plates;

FIG. 7 is a front view illustrating the essential parts of an embodiment of a lower knife in which a cut is formed;

FIG. 8 is a view describing the evaluation results of an experiment example 1;

FIG. 9 is a view describing the evaluation results of an experiment example 2;

FIG. 10 is a view of assistance in explaining the cutting conditions in the sample 1 in the sixth embodiment;

FIG. 11 is an enlarged view illustrating the essential parts of the cut part of a sheet in the sample 1;

FIG. 21 is a view describing the evaluation results of an experiment example 6; and FIG. 22 is a view describing the evaluation results of an experiment example 7.

DETAILED DESCRIPTION OF THE PREFERRED EMBODIMENTS

Figure 4:
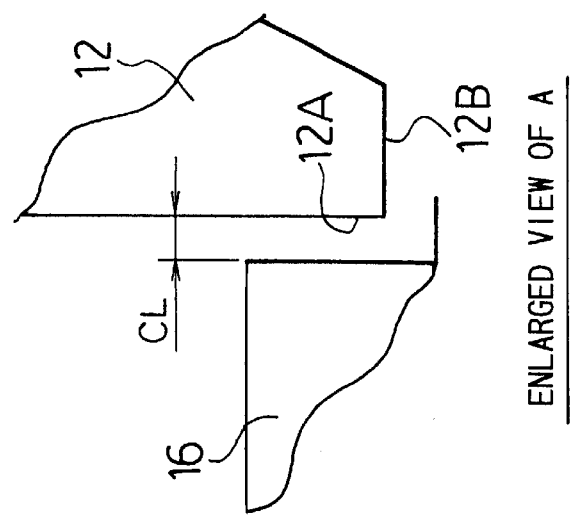
FIG. 4 is an enlarged view illustrating the part A in FIG. 3.

Hereunder the preferred embodiments for the method and apparatus for manufacturing a sensitized printing plate related to the present invention are described in detail according to the attached figures.

FIG. 1 is a front view of a cutting part of a slitter 10 which makes a pre-sensitized plate. In the slitter 10, upper knives 12, 14, 12 and lower knives 16, 18, 16 of the material Tool Steel (JIS SKD11) are arranged at predetermined intervals, and these knives cut two opposite sides of the pre-sensitized plates 20, 22. The slitter 10 cuts the two pre-sensitized plates 20, 22 from one original roll of web. The upper knives 12, 12 and the lower knives 16, 16 which are arranged at both sides are supported by columns 24. The columns 24 are supported on a rail 28 which is provided on a base 26, and they are slidable in the width direction of the pre-sensitized plates 20, 22. Thus, the columns 24 slide in accordance with the size of the pre-sensitized plates 20, 22.

Figure 2:
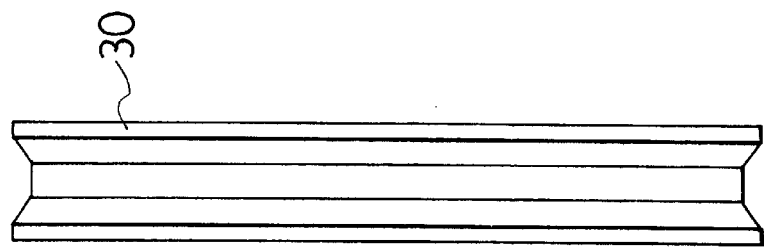
FIG. 2 is a front view illustrating another embodiment of upper knives.

In order to prevent the burr on a print surface (the upper side) of the pre-sensitized plates 20, 22, the upper knives 12, 14, 12 are arranged closer to lug shavings than to a position where the lower knives receive the surface of a product. At the central part, two knives are joined back to back to form the upper knife 14 in order to remove the lug shavings of the pre-sensitized plates 20, 22. In this embodiment, two knives are joined to form the upper knife 14; however, only one knife 30 may be provided as shown in FIG. 2.

Figure 3:
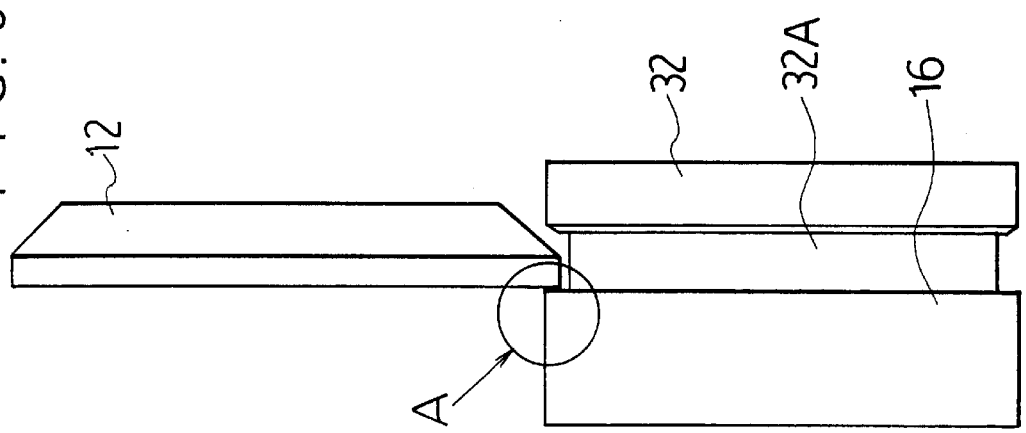
FIG. 3 is a front view describing a positional relation between upper knives and lower knives.

In FIG. 3, the lower knife 16 is provided with a spacer 32 which specifies the interval between the upper knife 12 and the lower knife 16. The outside diameter of the spacer 32 is substantially equal to the lower knife 16. A relief groove 32A is formed in the spacer 32, and the upper knife 12 positions into the relief groove 32A. In FIG. 4, the condition as to a clearance (CL) between the upper knife 12 and the lower knife 16 is determined in view of not only the relative positions of the upper and lower knives in the axial direction but also the thickness of the spacer 32 and the upper knife 12. Because the knives are joined as stated above, the edges at the upper part of the product curves.

[Embodiment 1]

In order to prevent the interference with the spacer which holds the lug shavings, a relief is provided at an angle of 60° with the end of 0.5 mm left. If the angle of the point of the knife at the end is maintained at 90°, the numerical values should not be restricted to the above-mentioned values.

The lug holding spacer has substantially the same diameter of the knife, and has a chamfer of CO.5 at its corner. The numerical value of the chamfer should not be restricted to the above-mentioned value. A clearance between the spacer and the knife is 3 mm so that the spacer can hold the narrow lug.

The diameter of the knife was $\phi 160$ mm. The roughness of the surface of knife points 12A, 12B is 0.4 S. CL is a clearance between the upper and lower knives. The clearance effects the form of the shear droop of the cut face, and the shear droop stains in the form of a frame.

A PS plate is made in the following manner and used as an evaluation material.

A roll plate of JISA1050 aluminum material, which had the thickness of 0.30 mm, was composed of aluminum of 99.5% by weight, which included copper of 0.01% by weight, titanium of 0.03% by weight, iron 0.3 of % by weight, and silicon of 0.1% by weight. The surface of the plate was grained by water suspension of 20% by weight, which was made of a pumice stone with 400 meshes and a rotary brush (6, 10- nylon). Then, the plate was washed well by water.

The plate was immersed in a sodium hydroxide aqueous solution of 15% by weight (including aluminum 4.5% by weight) and was etched so that the dissolution quantity of aluminum could be 5 g/m$^2$. Then, the plate was washed by running water. The sodium hydroxide was neutralized by nitric acid of 1% by weight, and then an electrolytic surface roughing process was executed with the quantity of electricity at 160 coulomb/dm$^2$ in a nitrate aqeous solution of 0.7% by weight (including aluminum of 0.5% by weight) by means of a rectangular wave alternating wavelength voltage (the current ratio r=0.90, the current wavelength mentioned in the description of Japanese Patent Publication No. 58-5796) whose anode voltage was 10.5 V and cathodic voltage was 9.3 V. After the plate was washed by water, it was immersed in sodium hydroxide aqueous solution of 10% by weight at 35° C., and was etched so that the dissolution quantity of aluminum can be 1 g/m$^2$. Then the plate was washed by water. Next, the plate was immersed in sulfuric acid aqueous solution of 30% by weight at 50° C. and the plate was desmutted and washed by water.

Direct current was used in sulfuric acid aqueous solution of 20% by weight (including aluminum of 0.8% by weight) at 35° C. to execute a process of forming porous positive pole anodic oxidation coatings. That is, the electrolysis was performed with current density at 13 A/dm$^2$, and the electrolysis time was adjusted so that the positive pole anodic oxidation coatings could be 2.7 g/m$^2$.

To make a negative photosensitive lithography plate using diazo resin and bonding agent, the base plate was washed by water, and then it was immersed in sodium silicate aqueous solution of 3% by weight at 70° C. for thirty seconds. Thereafter, the base plate was washed by water and dried.

The aluminum base plate which had been made in the above-mentioned manner had a reflection density of 0.30, which was measured by a Macbeth RD920 reflection density meter and the average roughness of a central line was 0.58 $\mu$m.

Next, aqueous solution of 1.0% by weight of methylmetacrylate/ethylacrylate/2-acrylamido-2-methylpropanesulfonic acid sodium copolymer (the average molecular weight: about 60,000) (mole ratio: 50/30/20) was coated on the base plate by a roll coater so that the amount of the coatings could be 0.05 g/m$^2$ after the coatings were dried.

The base plate was coated with a sensitive solution—1 by a bar coater, and was dried at 110° C. for forty-five seconds. The quantity of the solution to be coated and dried was 2.0 g/m$^2$.

| Photosensitive solution - 1 | |
| --- | --- |
| Diazo resin in a synthesis example 1 | 0.50 g |
| Bonding agent - 1 | 5.00 g |
| Stellite (HS-2) (made by Daido Kogyo Co., Ltd.) | 0.10 g |
| Victoria Blue B BOH | 0.15 g |
| Tricresyl Phosphate | 0.50 g |
| Dipicolinic Acid | 0.20 g |
| FC-430 (surface Active Agent made by 3M) | 0.05 g |
| Solvent | |
| 1-methoxy-2-propanol | 25.00 g |
| Lactic acid methyl | 12.00 g |
| Methanol | 30.00 g |
| Methyl ethyl ketone | 30.00 g |
| Water | 3.00 g |

The bonding agent-1 is a water-insoluble and alkaline water-soluble coating forming macromolecule of a copolymer of 2- hydroxy ethyl methacrylate/acrylonitrile/methylmethacrylate/metachrylic acid (the weight ratio is 50/20 /26/4, the average quantity of molecule is 75,000, and the acid content is 0.4 meq/g).

Stellite HS-2 (made by Daido Kogyo Co., Ltd.) is a macromolecule which has a higher oil sensitivity than the bonding agent, and a copolymer of styrene/maleic acid mono-4-methyl-2-pentyl ester=50/50 (mole ratio), and the average molecular weight is approximately 100,000.

Resin solution for forming a matt layer is jetted to the surface of the photosensitive layer, which is made in the above-mentioned manner, so that the matt layer can be formed.

Aqueous solution of 12% in which sodium salt is a part of a copolymer of methyl methacrylate/ethylacrylate/2-acrylamide-2-methyl propan sulfonic acid (charge weight ratio 65: 20 : 15) is used as the resin solution for forming the matt layer. Regarding a rotary atomization electrostatic coating machine, the number of rotations of an automatizing head was 25,000 rpm, the quantity of resin solution to be transferred was 4.0 ml per minute, and the voltage applied to the atomizing head was −90 kV, an ambient temperature during the coating was 25° C., and a relative humidity was 50%. The vapor is jetted to the coating surface by coating solution for 2.5 seconds. Three seconds after the coating surface got wet, the warm air whose temperature was 60° C. and humidity was 10% was jetted to the coating surface for five seconds. The matt was about 6 $\mu$m high on the average and about 30 $\mu$m in size on the average, and the coating amount was 150 mg/m$^2$.

The coil PS plate which is 0.3 mm thick and 820 mm wide is cut under several conditions by the slitter so that the width of the PS plate can be 400 mm. Then, the PS plate is cut into a sheet which is 1100 mm long.

Thereafter, an image is exposed on the produced sheet, and the sheet is developed by 800H (an automatic developing machine made by Fuji Photo Film Co., Ltd) with a solution which is made by diluting DN-3C (alkaline water soluble developing solution made by Fuji Photo Film Co., Ltd.) with water at 1:1. Immediately after that, a solution which is made by diluting FN-2 (gum made by Fuji Photo Film Co., Ltd.) with water at 1:1 is coated on the sheet and is dried. An offset rotary printer prints 20,000 plates at a speed of 100,000 per hour, using newspaper ink of Sakata Ink Co., Ltd. and Toyo water of Toyo Ink Co., Ltd.; and how the end is stained was evaluated. The evaluation results are shown in FIG. 8.

Figure 5:
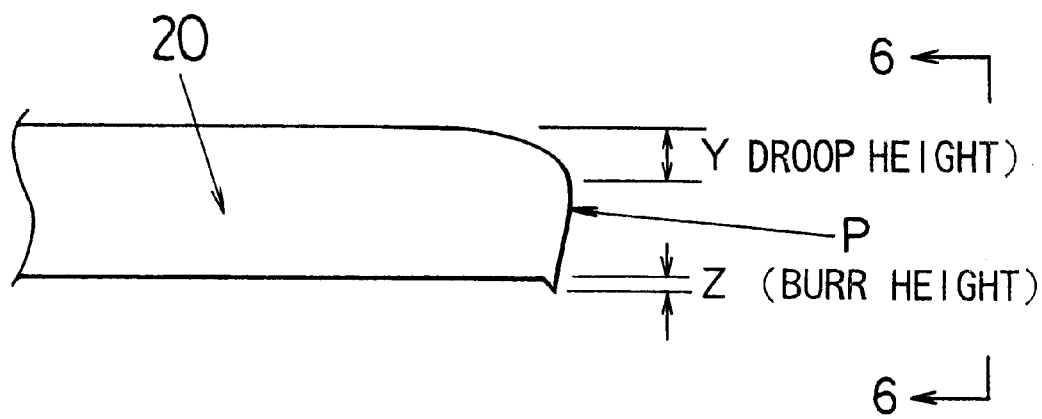
FIG. 5 is an enlarged view illustrating the cut part of the pre-sensitized plate.
Figure 6:
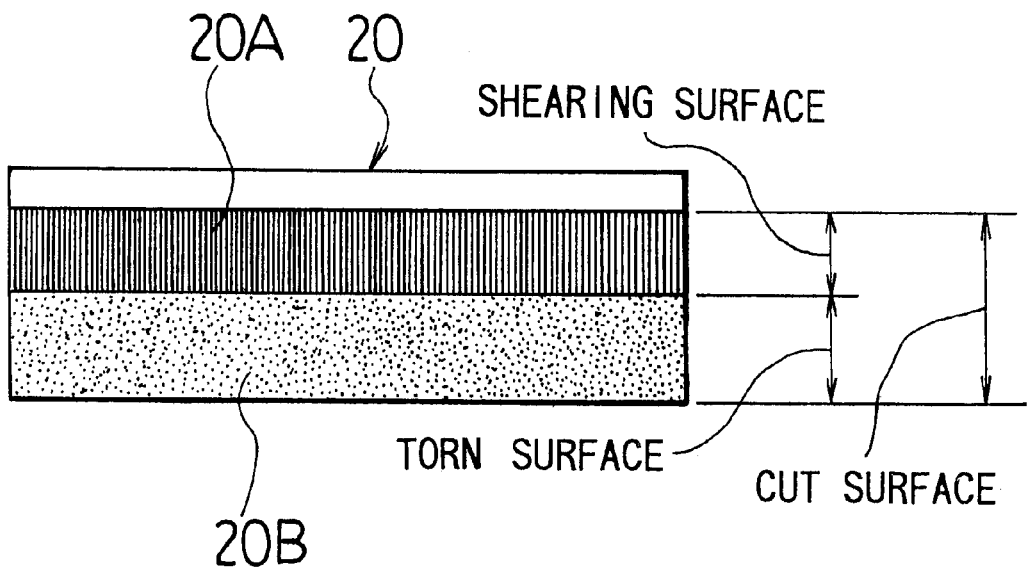
FIG. 6 is a side view illustrating the cut part, taken on line 6—6 of FIG. 5.

In FIG. 5, Y is the shear droop height of the cut part of the PS plate 20, and Z is the burr height of the cut part of the PS plate 20. The average S of maximum height of the roughness on the cut surface is a value which is obtained by a summation average of the maximum height of the shearing surface 20A and the maximum height of the torn surface 20B with the ratio between the two on the cut surface.

If a clearance (CL) is 0 $\mu$m, the shear droop height is between 10 $\mu$m and 20 $\mu$m, and if the clearance is increased to CL 30, 45, 55, 70, 100, and 120 $\mu$m, the shear droop height is also increased to 20–35, 40–55, 50–65, 60–75, 85–100, 110–125 $\mu$m. The average maximum height of the roughness on the cut surface is also increased with the increase of the clearance. That is because the shearing surface becomes rough due to the increase of the clearance, and the ratio of the torn surface which is rougher than the shearing surface increases.

How the edge is, when the clearance is 0, the evaluation is X; the evaluation result improves gradually. If the clearance CL is 30 $\mu$m, the evaluation is $\Delta$. If the clearance CL is 45 jim, the evaluation is $\bigcirc \Delta$. If the clearance CL is more than 55 $\mu$m, the evaluation is $\bigcirc$. Regarding the evaluations for the stain of the frame, $\bigcirc$ means no stain, $\Delta$ means lightly stained, and X means stained with lines on the whole surface; the evaluations for medians are performed by the length and intensity of the stain.

On the other hand, despite changing the length of the part where the upper and lower knife overlap as 0.2 mm–0.4mm, there was no difference in the stain of the frame. Moreover, when evaluating a product which is bent down as 100 $\mu$m at the clearance 0, the result was $\Delta$. Thereby, a large clearance is better for preventing the stain of the frame; however, the burr height of the bottom surface increases with the increase of the clearance. When the clearance is 70 $\mu$m, the burr height is 30 $\mu$m; when the clearance is 100 $\mu$m, the burr height is 50 $\mu$m.

The increase of the shear droop height can remove the stain of the frame. If, however, the shear droop height exceeds 100 $\mu$m, the burr height of the bottom surface exceeds 50 $\mu$m. For this reason, when the sensitized printing plate is set in an automatic processing machine, the transfer cannot be performed well, and the printing body of the printing machine gets damaged. Thus, in order to prevent the plate from getting stained and to prevent a bad effect during processing, the clearance is preferably between 30 $\mu$m and 100 $\mu$m. Moreover, if the burr height is controlled to be less than 50 $\mu$m, the transfer can be correctly performed in the processing machine.

[Embodiment 2]

The cutting is performed in such a manner that the slitter and the pre-sensitized plate, which are used in the embodiment 1, are used but a different cutting knife is used. A dished knife edge of 60° is used as the upper knife, the shear droop becomes smaller to about ⅓, and the frame staining gets worse.

Next, the upper knives whose points have different roughness are used to cut the plate so as to find how the difference of the points effects the roughness of the cut surface. The clearance is 30 $\mu$m where a significant difference can be seen, and it is confirmed whether the difference in the roughness of the points of the upper knives can reduce the stain of the frame. The result is shown in FIG. 9.

The roughness of the knife shown in FIG. 9 described above is the finished roughness of the surface indicated in 12A or 12B of FIG. 4; the maximum height average S of the roughness of a cut surface is the value which is obtained the same as the FIG. 8.

When the point roughness is 0.8 S, the average S of maximum height of the roughness of the end face P of the cut surface in FIG. 5 was 1.2. When the PS plates were used for printing and evaluated, there is a difference in the frame stain. When the average S was 0.8 μm, the evaluation was X. As the average S increased to 1.2 μm and 2.6 μm, the stain of the frame can be decreased. It was confirmed that the increase in the roughness improved the hydrophilic property of the cut surface. Thus, the average maximum height of the roughness of the cut surface is preferably more than 1.2 μm.

[Embodiment 3]

Furthermore, the slitter and the PS plate, which had been used in the embodiments 1 and 2, were used to confirm the upper limit of the roughness, and the knife whose point has the roughness of 3 μm was used for a cutting test. The clearance was 100 μm in view of the forming of the burr. The average of maximum height of the roughness of the cut surface was 12.6 μm, and the frame stain did not occur. However, the chips adhered to the cut surface during the cutting. As a result, the chips are undesirable in view of the quality of the surface because a trouble such as the print ambiguity is caused during the processing, and thus, this condition cannot be adopted.

[Embodiment 4]

An upper knife 34 shown in FIG. 7 was used in the slitter of the embodiment 1 to cut the PS plate. In this case, a solid line in FIG. 7 indicates the state at the bottom of the knife, and a long and two short alternate lines indicate the state where the upper knife starts cutting into the PS plate. When the upper knife 34 is set in the slitter, a side 34A of the knife 34 and a side 16A of the lower knife 16, which overlap one another at the bottom of the point of the knife, are abutted against one another. Thus, at a point where the knife actually cuts into the PS plate (the solid line in FIG. 7), the cutting starts at a position where there is a clearance of X which is a notch in the upper knife. Thereby, if this knife is used, the complicated operation of setting the clearance can be performed only by abutting the upper and lower knives against one another.

Y was 0.3 mm, and as X was increased to 30 μm, 70 μm and 100 μm, the shear droop height increased to 20 μm, 50 μm and 80 μm at five positions on the average. The stain was removed to Δ, ⊙ and ○. When the depth of the notch was 0.5 mm, the same result came out.

[Embodiment 5]

An aluminum plate, whose surface has not been processed, was cut by the slitter of the embodiment 1 under the cutting condition of the embodiment 1 (clearance: 55 μm), and then the PS plate, whose surface has been processed and which is coated with a photosensitive layer, was used to print and evaluated. However, the frame-shaped stain did not occur as is the case in the first embodiment.

[Embodiment 6]

The following PS plate was made and used as an evaluation material.

A roll plate of JISA1050 aluminum material, which was 0.30 mm thick, was composed of aluminum of 99.5% by weight, which included copper of 0.01% by weight, titanium of 0.03% by weight, iron 0.3% by weight, and silicon of 0.1% by weight. The surface of the plate was grained in water suspension of 20% by weight, which was made of a pumice stone with 400 meshes and a rotary brush (6, 10 - nylon). Then, the plate was washed well by water.

The plate was immersed in sodium hydroxide aqueous solution of 5% by weight (including aluminum 4.5% by weight) and was etched so hat the dissolution quantity of aluminum could be 5 g/m². Then, the plate as washed by running water. The sodium hydroxide was neutralized by nitric acid of 1% by weight, and then an electrolytic surface roughing process was executed with the quantity of electricity at 160 coulomb/dm² in nitrate aqeous solution of 0.7% by weight (including aluminum of 0.5% by weight) by means of a rectangular wave alternating wavelength voltage (the current ratio r=0.90, the current wavelength mentioned in the description of Japanese Patent Publication No. 58-5796) whose anode voltage was 10.5V and cathodic voltage was 9.3V. After the plate was washed by water, it was immersed in sodium hydroxide aqueous solution of 10% by weight at 35° C., and was etched so that the dissolution quantity of aluminum can be 1 g/m². Then the plate was washed by water. Next, the plate was immersed in sulfuric acid aqueous solution of 30% by weight at 50° C., and the plate was desmutted and washed by water.

Direct current was used in sulfuric acid aqueous solution of 20% by weight (including aluminum of 0.8% by weight) at 35° C. to execute a process of forming porous positive pole anodic oxidation coatings. That is, the electrolysis was performed with current density at 13A/dm², and the electrolysis time was adjusted so that the positive pole anodic oxidation coatings could be 2.7 g/m².

To make a negative photosensitive lithography plate using diazo resin and bonding agent, the base plate was washed by water, and then it was immersed in sodium silicate aqueous solution of 3% by weight at 70° C. for thirty seconds. Thereafter, the base plate was washed by water and dried.

The aluminum base plate which had been made in the above-mentioned manner had a reflection density of 0.30, which was measured by a Macbeth RD920 reflection density meter and the average roughness of a central line was 0.58 μm.

Next, aqueous solution of 1.0% by weight of methylmetacrylate/ethylacrylate/2-acrylamido-2-methylpropanesulfonic acid sodium copolymer (the average molecular weight: about 60,000) (mole ratio: 50/30/20) was coated on the base plate by a roll coater so that the amount of the coatings could be 0.05 g/m² after the coatings were dried.

The base plate is coated with a sensitive solution −1 by a bar coater, and is dried at 110° C. for forty-five seconds. The quantity of the solution to be coated and dried is 2.0 g/m².

| Photosensitive solution - 1 | |
|---|---|
| Diazo resin in a synthesis example 1 | 0.50 g |
| Bonding agent - 1 | 5.00 g |
| Stellite (HS-2) (made by Daido Kogyo Co., Ltd.) | 0.10 g |
| Victoria Blue B BOH | 0.15 g |
| Tricresyl Phosphate | 0.50 g |
| Dipicolinic Acid | 0.20 g |
| FC-430 (surface Active Agent made by 3M) | 0.05 g |
| Solvent | |
| 1-methoxy-2-propanol | 25.00 g |
| Lactic acid methy | 12.00 g |
| Methanol | 30.00 g |
| Methyl ethyl ketone | 30.00 g |
| Water | 3.00 g |

The bonding agent-1 is a water-insoluble and alkaline water-soluble coating forming macromolecule of a copolymer of 2- hydroxy ethyl methacrylate/acrylonitrile/methylmethacrylate/metachrylic acid copolymer (the weight ratio is 50/20/26/4, the average quantity of molecule is 75,000, and the acid content is 0.4 meq/g).

Stellite HS-2 (made by Daido Kogyo Co., Ltd.) is a high polymer compound which has a higher oil sensitivity than the bonding agent, and a copolymer of styrene/maleic acid mono-4-methyl-2-pentyl ester=50/50 (mole ratio), and the average molecular weight is approximately 100,000.

Resin solution for forming a matt layer is jetted to the surface of the photosensitive layer, which is made in the above-mentioned manner, so that the matt layer can be formed.

Aqueous solution of 12% in which sodium salt is a part of a copolymer of methylmethacrylate/ethylacrylate/2-acrylamide-2-methyl propan sulfonic acid (charge weight ratio 65:20:15) is used as the resin solution for forming the matt layer. Regarding a rotary atomization electrostatic coating machine, the number of rotations of an automatizing head was 25,000 rpm, the quantity of resin solution to be transferred was 4.0 ml per minute, and the voltage applied to the atomizing head was −90kv, an ambient temperature during the coating was 25° C., and a relative humidity was 50%. The vapor is jetted to the coating surface by coating solution for 2.5 seconds. Three seconds after the coating surface got wet, the warm air whose temperature was 60° C. and humidity was 10% was jetted to the coating surface for five seconds. The matt was about 6 $\mu$m high on the average and about 30 $\mu$m in size on the average, and the coating amount was 150 mg/m$^2$.

The coil PS plate which is 0.3 mm thick and 820 mm wide is cut under several conditions by the slitter so that the width of the PS plate can be 400 mm. Then, the PS plate is cut into sheet which 1100 mm long.

A variety of samples were used by changing the clearance and the shape of the knife: for example, a sample which had the small shear droop and no crack, and a sample which had the shear droop of more than 20 $\mu$m and had cracks at different positions. If the quantity of the vertical lap of the upper and lower knives was changed from 30% to 150%, the samples were processed in such a state that the quantity of the lap was kept 100%. When the printing was evaluated, the image was exposed on the produced sheet, and the sheet was developed in DN-3C (an alkali developing solution made by Fuji Photo Film Co., Ltd.), which was diluted with water at 1:1, by 800H (an automatic developing machine, for example, as made for Fuji Photo Film Co., Ltd.). Two different kinds of finishers FN-2 (gum made by Fuji Photo Film Co., Ltd.) and FN-6 (gum made by Fuji Photo Film Co., Ltd.) are used to compare how the shear droop can be insensitive to the oil. On completion of the development, FN-2 and FN-6, which had been diluted with water at 1:1, were coated on the sheet and the sheet was dried, and thus, the processing was completed. An offset rotary printing machine printed 20,000 printing plates with mazenta ink, which causes the stain resulting from the cracks, at a speed of 100,000 per hour, and the stain at the end was evaluated. The result is shown in FIG. 21.

Y is the shear droop height at the cut part of the PS plate shown in FIG. 5, and Z is the burr height.

As is clear from the above-mentioned result, if the clearance between the upper and lower knives is 0 and an acute-angled knife 50 (the angle of point is 60°) in FIG. 5 is used as the upper knife for the cutting operation, sheet 52 of a sample 1 has little shear droop and no crack at its edge 53 as shown in FIG. 11. The sample 1, however, has no shear droop, and the linear stain may occur. In this case, the crack means the one whose opening is wider than 0.5 $\mu$m on the surface of the sheet. Reference numeral 54 in FIG. 10 is the lower knife.

Figure 12:
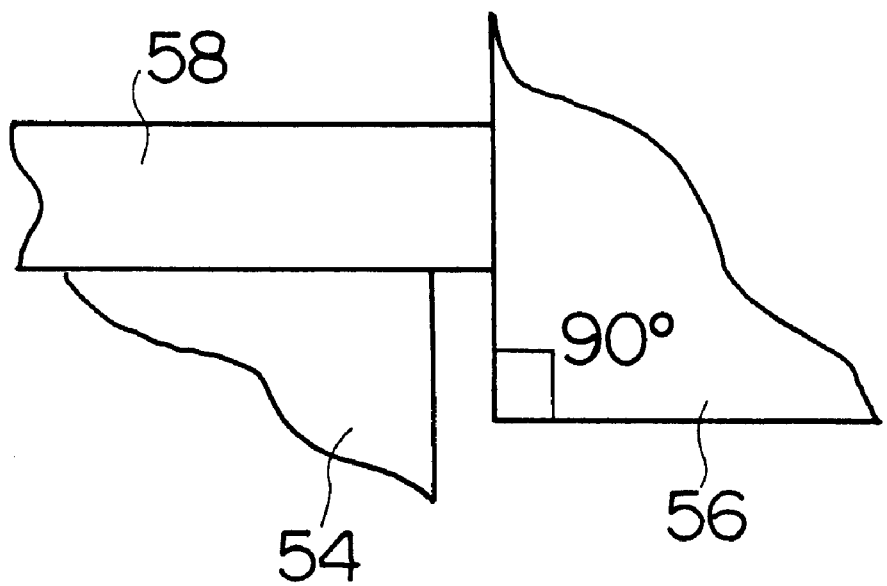
FIG. 12 is a view of assistance in explaining the cutting conditions of the sample 2 in the sixth embodiment.
Figure 13:
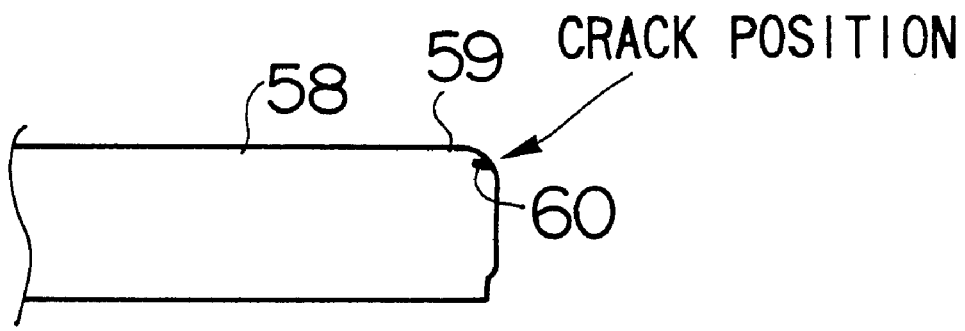
FIG. 13 is an enlarged view illustrating the essential parts of the cut part of sheet in the sample 2.

If the clearance is 0 and a right-angled knife 56 in FIG. 12 is used as the upper knife for the cutting operation, sheet 58 of a sample 2 has more shear droop than in the sample 1 as shown in FIG. 13. The shear droop, however, centers on an edge 59, and a crack 60 is also generated at the edge 59 of the sheet 58.

In samples 3–6, the clearance is wider than in the case of the samples 1 and 2.

Figure 14:
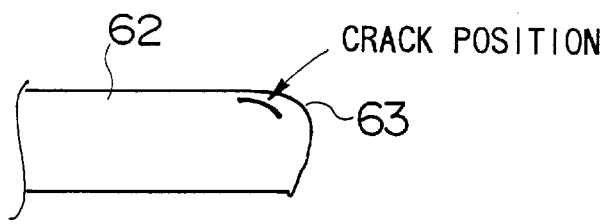
FIG. 14 is an enlarged view illustrating the essential parts of the cut part of sheet in the samples 3, 4, 5 and 6.

Because the aluminum base plate has the thickness of 0.3 mm in this embodiment, the clearance between the upper and lower knives which cut the base plate is preferably between 5% and 40% of the thickness. As the clearance is widened to 25 $\mu$m, 30 $\mu$m and 55 $\mu$m, the sheet has larger shear droop as shown in the example of the sheet 62 in FIG. 14, and the shear drooping positions are diffused and the shear drooping of an edge end 63 is reduced. Thus, the cracks are diffused to positions away from the edge end 63. The sheet of the sample 4 is in substantially an optimum state.

Figure 15:
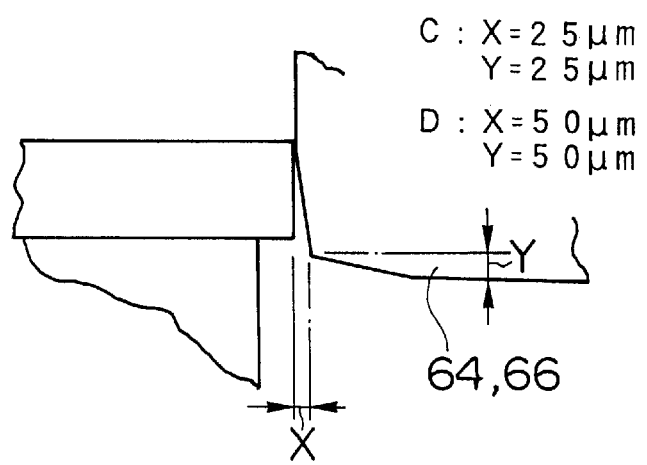
FIG. 15 is a view of assistance in explaining the cutting conditions of the samples 5, 7 and 10.

On the other hand, the change due to the abrasion of the knife is represented by samples 7–11. With the abrasion of the edge, the sheet increases pulling action. Thus, the deformation of the edge end is increased, and thereby the cracks are diffused at the end, too. For this reason, when a knife D was used, the samples 8 and 11 got stained by the cracks. The upper knife which cut the samples 5, 7 and 10 was the upper knife 64 which had worn vertically and horizontally as shown in FIG. 15.

The quantity X of the vertical abrasion was 25 $\mu$m, and the quantity Y of the horizontal abrasion was 25 $\mu$m. In the case of the upper knife 66 which cut the samples 8 and 11, the quantity X of the vertical abrasion was 50 $\mu$m, and the quantity Y of the horizontal abrasion was 50 $\mu$m as shown in FIG. 15. As the clearance widened, the stain caused by the crack was decreased because the crack is generated at a position far away from the end of the cut part. As the burr at the bottom, however, became larger, it had a bad effect on the transfer in the processing machine. Thus, the clearance is preferably 30 to 100 $\mu$m.

[Embodiment 7]

Figure 18:
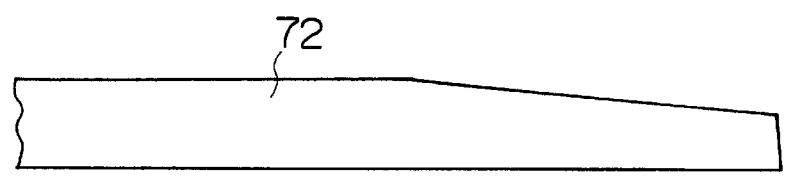
FIG. 18 is a view of assistance in explaining the lower knife whose bottom face is filed so that the bottom surface is mainly parallel with the upper knife.
Figure 19:
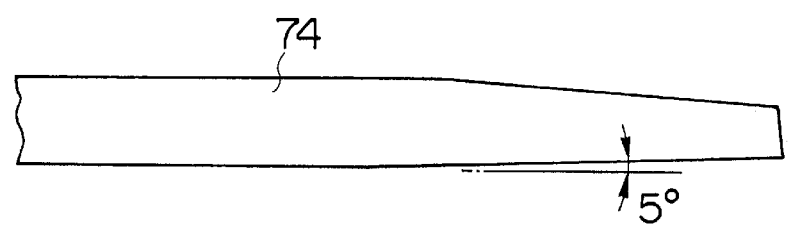
FIG. 19 is a view of assistance in explaining the lower knife whose bottom face is filed so that the top face can be angled at 5°.
Figure 20:
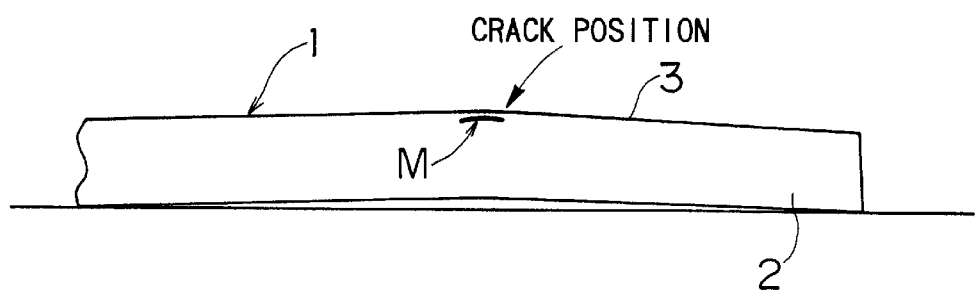
FIG. 20 is a view of assistance in explaining the sheet in which cracks are concentrated in an area in a proximity to a summit on the surface.

The slitter and the pre-sensitized plate, which were in the embodiment 1, were used, and the lower knife 68 was tiered, so as to make a sample 12 and confirm how the sample was stained. A sample 13 was made by filing the bottom face of the sample 12 to be substantially parallel to bottom face at the inside of the printing plate as shown in FIG. 18, and a sample 14 was made by further filing the bottom face of the sample 13 so that the top face can be angled at 5° as shown in FIG. 19. The FN-2 and the FN-6 were used as the finisher. The results of the experiment are shown in FIG. 22.

Figure 16:
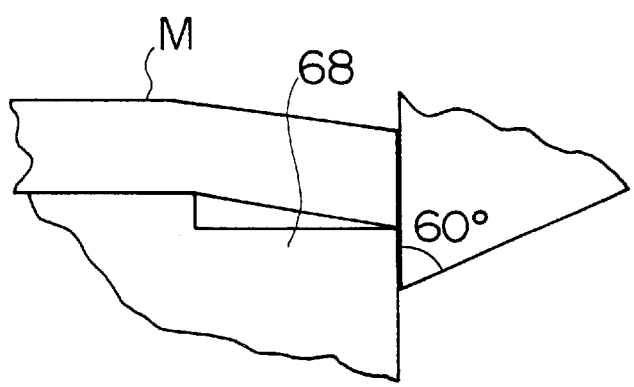
FIG. 16 is a view of assistance in explaining the cutting conditions of the samples 8 and 11.
Figure 17:
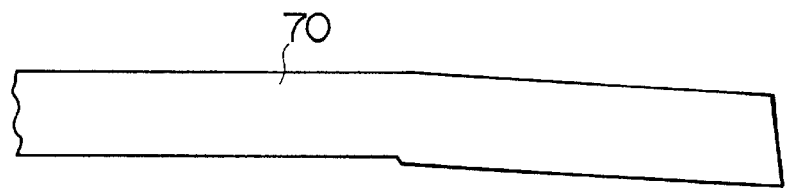
FIG. 17 is a view of assistance in explaining the tiered lower knife.

As shown in FIG. 16, a crack was generated at a point M where the sheet of the sample 12 starts bending, and there was no crack at the end of the edge. When the sample 12 was used for printing, the stain occurs at a position corresponding to the point M except for the end of the edge. The sheet, which was cut by the upper knife bending down, rises at the edge by a length in which the lower knife projects down, and thus, the point M of the sheet most strongly abuts against a printing roll. For this reason, the sheet is easily stained because of the cracks at the point M. On the other hand, the samples 13 and 14 whose lower knife had been filed were less stained. The sample 6, which was evaluated at the same time, was not stained.

[Embodiment 8]

Under the processing conditions of the sample 6 in the embodiment 1, the stain caused by the cracks was confirmed.

Since the surface is easily damaged when the amount of the anodic oxidation coatings are small, cutting samples were made by increasing the anodic oxidation coatings from 1.5 g/m² to 2.5 g/m², 3.5 g/m² and 4.5 g/m² under the same conditions except for the anodic oxidation coatings. The samples whose anodic oxidation coatings were 1.5 g/m², 2.5 g/m² and 3.5 g/m² were good; however, the sample whose anodic oxidation coatings were 4.5 g/m² had the large crack openings and had a crack of more than 0.5 μm at its forward end, and the sample was greatly stained because of the cracks. Consequently, it was realized that the stain caused by the cracks could be prevented if the amount of the anodic oxidation coatings is 1.5 g/m² to 3.5 g/m².

In this embodiment, the sensitized printing plate was explained; however, in the case of cutting the base plate in which the sensitive layer has not been formed yet, if the clearance between the upper and lower knives for cutting the base plate is set at 30 to 100 μm, it is possible to prevent the stain resulting from the cracks which appear during the cutting.

As stated above, according to the sensitized printing plate and the method and apparatus for manufacturing the sensitized printing plate in the present invention, the sensitized printing plate was cut by the slitter in which the clearance between the upper and lower knives is 30 to 100 μm. The sensitized printing plate has the shear droop of 20 to 100 μm high at the cut end, and the average of the maximum height of the surface roughness of the cut surface is 1.2 to 12 μm. For this reason, the stain of the frame can be significantly reduced. Moreover, the burr at the reverse side of the printing face is controlled so that the transfer can be correctly performed in the printing machine. Further, compared to the method which shaves the edge, the transfer can be performed more stable, and compared to the method which merely performs the chemical treatment of the end face, the performance of the printing machine can be improved.

As set forth hereinabove, according to the sensitized printing plate and the method and apparatus for manufacturing the sensitized printing plate in the present invention, the clearance between the upper and lower knives for cutting the sensitized printing plate is 30 to 100 μm so as to prevent the stain resulting from the cracks which appear during the cutting.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a sensitized printing plate in which a sensitive layer is formed on a metallic base plate provided with a hydrophilic surface, said method comprising the step of setting a clearance between an upper knife and a lower knife at 30 to 100 μm and such that a length of a portion where said upper knife and said lower knife overlap is greater than zero so as to be a positive value, and cutting said sensitized printing plate with said upper knife and lower knife, so that said metallic base plate maintains a bottom surface which is substantially flat and said sensitized printing plate has an upper surface edge which is rounded after said cutting and so that shear droops are 20 to 100 μm high at opposite two or four sides of said metallic base plate, thereby to prevent said sensitized printing plate from becoming stained.

2. The method of manufacturing the sensitized printing plate as defined in claim 1, further comprising the step of setting the clearance between said upper knife and said lower knife at 30 to 100 μm and cutting said sensitized printing plate, so that an average of maximum height of surface roughness of a cut surface of said metallic base plate is 1.2 to 12 μm.

3. A method of manufacturing a sensitized printing plate in which a sensitive layer is formed on a metallic base plate provided with a hydrophilic surface, said method comprising the step of setting a clearance between an upper knife and a lower knife for cutting said sensitized printing plate at 30 to 100 μm, so that when said sensitized printing plate is cut, said metallic base plate maintains a bottom surface which is substantially flat and said sensitized printing plate has an upper, printing surface with a surface edge which is rounded after said cutting and a crack is generated on the upper, printing surface at a position which is more than 25 μm inward from an end of said sensitized printing plate along the rounded surface edge.

* * * * *